United States Patent [19]

Makuta

[11] Patent Number: 5,221,429
[45] Date of Patent: Jun. 22, 1993

[54] METHOD OF MANUFACTURING PHASE-SHIFTED DIFFRACTION GRATING

[75] Inventor: Akio Makuta, Yokohama, Japan

[73] Assignee: Kabushiki Kaisha Toshiba, Kanagawa, Japan

[21] Appl. No.: 778,942

[22] PCT Filed: Apr. 17, 1991

[86] PCT No.: PCT/JP91/00502

§ 371 Date: Feb. 7, 1992

§ 102(e) Date: Feb. 7, 1992

[30] Foreign Application Priority Data

Apr. 19, 1990 [JP] Japan ................. 2-101590

[51] Int. Cl.$^5$ .............. H01L 21/306; B44C 1/22; C03C 15/00; C23F 1/00
[52] U.S. Cl. .................... 156/661.1; 156/656; 156/657; 156/659.1; 156/662; 430/321; 430/323
[58] Field of Search ............... 156/643, 652, 654, 656, 156/657, 659.1, 661.1, 662; 430/296, 312, 313, 316, 321, 323, 329

[56] References Cited

U.S. PATENT DOCUMENTS 4,895,790  1/1990  Swanson et al. ............ 156/654 X
4,988,404  1/1991  Aoyagi ..................... 156/654 X
5,024,726  6/1991  Fujiwara ................... 156/657 X

FOREIGN PATENT DOCUMENTS 0246701  11/1986  Japan.
63-70475  3/1988  Japan.

OTHER PUBLICATIONS

Shirasaki et al., Fujitsu Laboratories Ltd., Technical Report OQE85-60, "λ/4-Shifted DFB-LD Corrugation Formed by a Novel Spatial Phase Modulating Mask", Institute of Electronics and Communication Engineers of Japan.

Yamaguchi et al., Photoelectronic Laboratory of NEC Corporation, "Manufacture of λ/4-Shifted Diffraction Grating Using a Phase Shift Film," Japan Society of Applied Physics, lecture No. 29P-T-8 (1986).

Utaka et al., "λ/4-Shifted InGaAsP/InP DFB Lasers by Simultaneous Holographic Exposure of Positive and Negative Photoresists," Electronic Letters, vol. 20, No. 24, pp. 1008-1010, Nov. 22, 1984.

Primary Examiner—William A. Powell
Attorney, Agent, or Firm—Finnegan, Henderson, Farabow, Garrett & Dunner

[57] ABSTRACT

A photoresist 12 is coated on a substrate 11, and a phase shift medium 13 is formed on the photoresist 12. The phase shift medium 13 is patterned. Thereafter, first and second laser beams 16 and 17 having asymmetric incidence angles with respect to the substrate 11 are radiated on the photoresist 12 to perform an interference exposing operation. The photoresist 12 is developed and post-baked, and the substrate 11 is etched using the photoresist 12 as a mask, thereby forming a diffraction grating having a discontinuous phase portion.

4 Claims, 9 Drawing Sheets

METHOD OF MANUFACTURING PHASE-SHIFTED DIFFRACTION GRATING

TECHNICAL FIELD

The present invention relates particularly to a method of manufacturing a phase-shifted diffraction grating having a discontinuous phase portion.

BACKGROUND ART

A conventional method of manufacturing a diffraction grating using a two-beam interference method is mainly employed in a DFB (Distributed FeedBack) laser to be described later.

The DFB laser uses a diffraction grating (periodical projection structure) formed in a waveguide as a reflection mechanism for a laser beam. The DFB laser oscillates in a single mode at or near the Bragg wavelength defined by the period of the diffraction grating. In addition, when the DFB laser is to be modulated at a high speed, since it is operated in the single mode, it is expected as a light source of a long-distance large-capacity optical communication system using optical fibers.

When a DFB laser having a waveguide on which a uniform diffraction grating is formed has both end faces having a small reflectance, since the DFB laser easily oscillates at two wavelengths one of which is shorter than the Bragg wavelength and the other of which is longer than the Bragg wavelength, the DFB laser cannot easily oscillate in a single longitudinal mode. Therefore, there is proposed a λ/4-shifted DFB laser which oscillates at a single mode such that the phase of a diffraction grating is shifted by λ/4 (a phase amount of π/2) in the central portion of a laser resonator. In addition, there is proposed a DFB laser which oscillates at a wavelength equal to the Bragg wavelength by a two-beam interference method using positive and negative photoresists (this DFB laser is described in, e.g., Electronics Letters Vol. 20, NO 24, 1984, PP 1,008–1,010). In specific element performance, it is reported that a high production yield can be obtained by using a λ/8-shifted diffraction grating having a shift amount half that of the λ/4-shifted diffraction grating (this is described in, e.g., the Institute of Electronics and Communication Engineers of Japan, Technical Report OQE86-150).

FIGS. 1A to 1F show a method of manufacturing a diffraction grating using positive and negative photoresists.

Figure 1A:
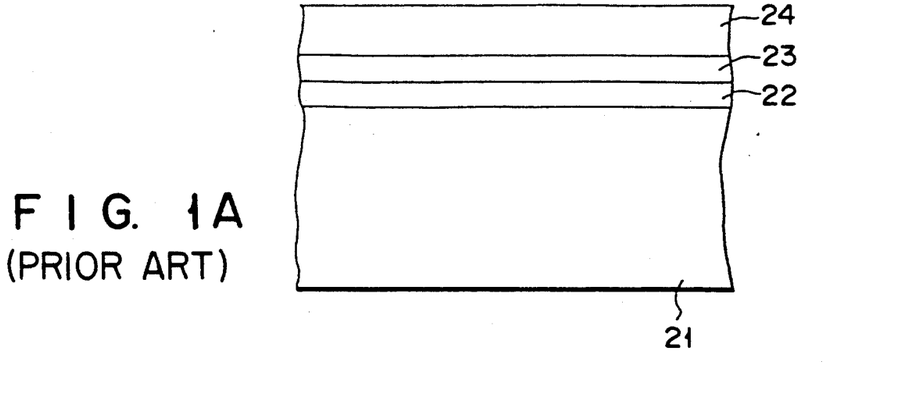
FIGS. 1A to 1F are sectional views showing a conventional method of manufacturing a phase-shifted diffraction grating.
Figure 1B:
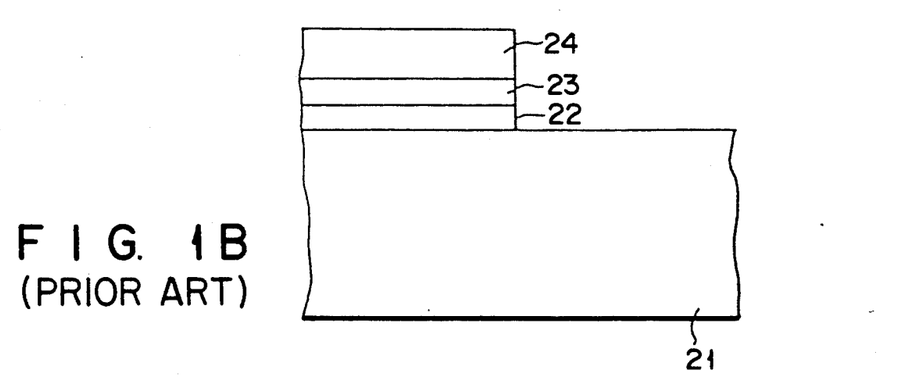
Figure 1C:
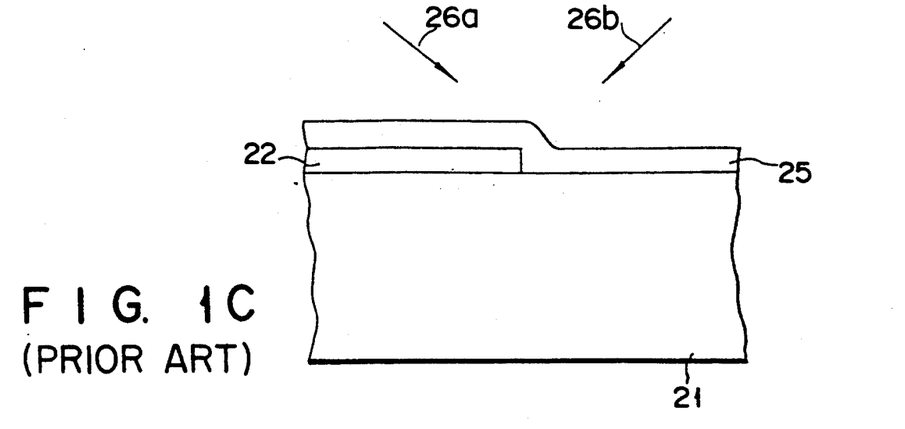
Figure 1D:
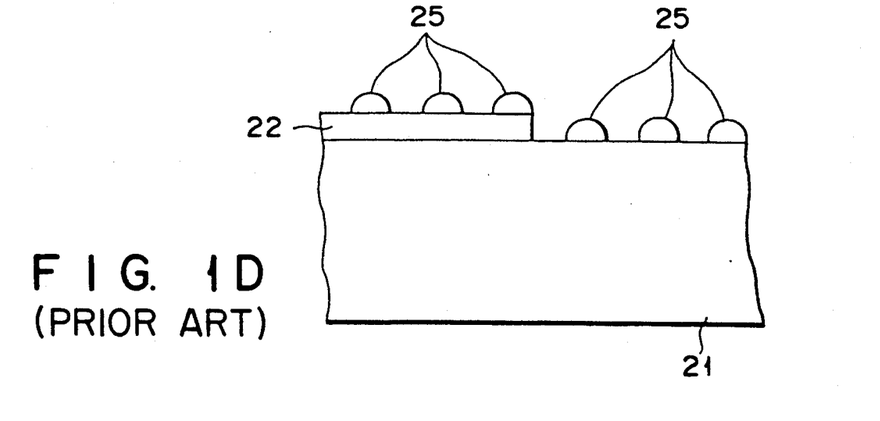
Figure 1E:
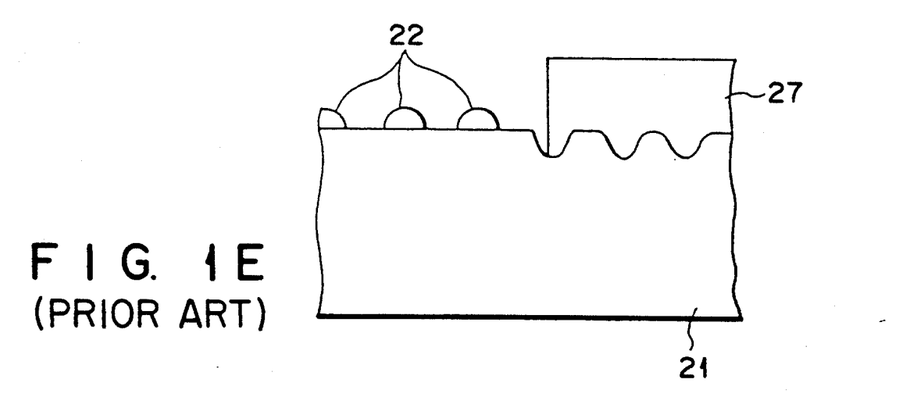
Figure 1F:
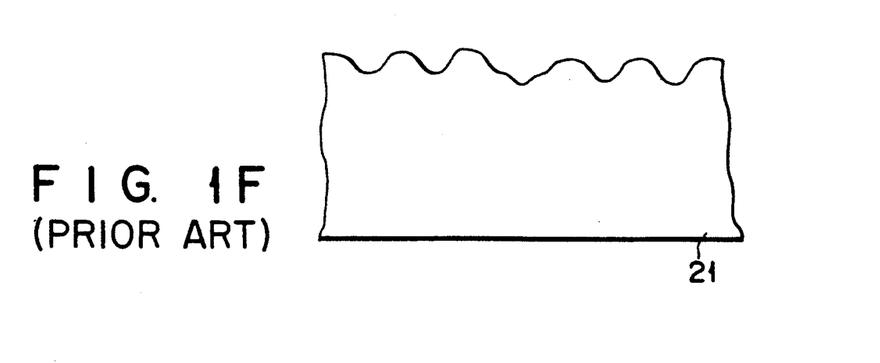

As shown in FIG. 1A, a negative photoresist 22 is formed on an InP substrate 21. An intermediate layer 23 is formed on the negative photoresist 22. A positive photoresist 24 is formed on the intermediate layer 23. As shown in FIG. 1B, the positive photoresist 24 is patterned. Thereafter, the intermediate layer 23 and the negative photoresist 22 are etched using the positive photoresist 24 as a mask. As shown in FIG. 1C, the intermediate layer 23 and the positive photoresist 24 are removed. Thereafter, a positive photoresist 25 is formed on the entire surface of the resultant structure. A two-beam interference exposure operation is performed using first and second laser beams 26A and 26B. As shown in FIG. 1D, the positive photoresist 25 is developed. As shown in FIG. 1E, after the InP substrate 21 is etched using a hydrogen bromide-based etchant, the positive photoresist 25 is removed. A positive photoresist (protection film) 27 is formed on only a portion where the InP substrate 21 is etched. Thereafter, the negative photoresist 22 is developed. As shown in FIG. 1F, the InP substrate 21 is etched using a hydrogen bromide-based etchant, and the negative and positive photoresists 22 and 27 are removed, thereby obtaining a phase-shifted diffraction grating.

In the method using the negative and positive photoresists, the negative and positive photoresists are simultaneously used. For this reason, the thicknesses of the photoresists and an exposure time of two-beam interference cannot easily be adjusted. The shapes of diffraction gratings formed in the regions of the negative and positive photoresists may be different from each other. In addition, when a shift amount of the phase of the diffraction grating is adjusted, the shift amount cannot help being set in an amount of λ/4 (i.e., a phase amount of π/2).

As a method of obtaining an arbitrary shift amount, there is a manufacturing method using a glass mask, e.g., reported in the Technical Report OQE85-60, the Institute of Electronics and Communication Engineers of Japan. In addition, there is also a manufacturing method using a phase shift film (1986, the Japan Society of Applied Physics, lecture No. 29P-T-8).

FIGS. 2A to 2D show a manufacturing method using a phase shift film.

Figure 2A:
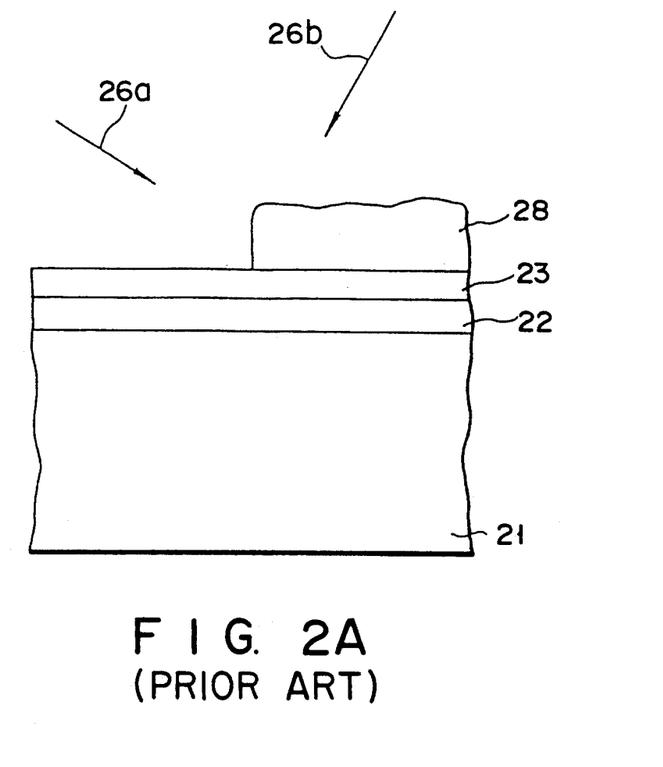
FIGS. 2A to 2D are sectional views showing a conventional method of manufacturing a phase-shifted diffraction grating.
Figure 2B:
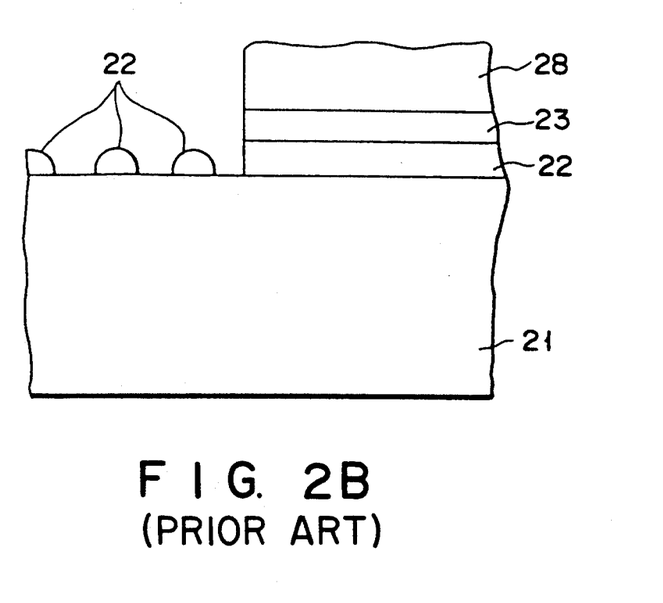
Figure 2C:
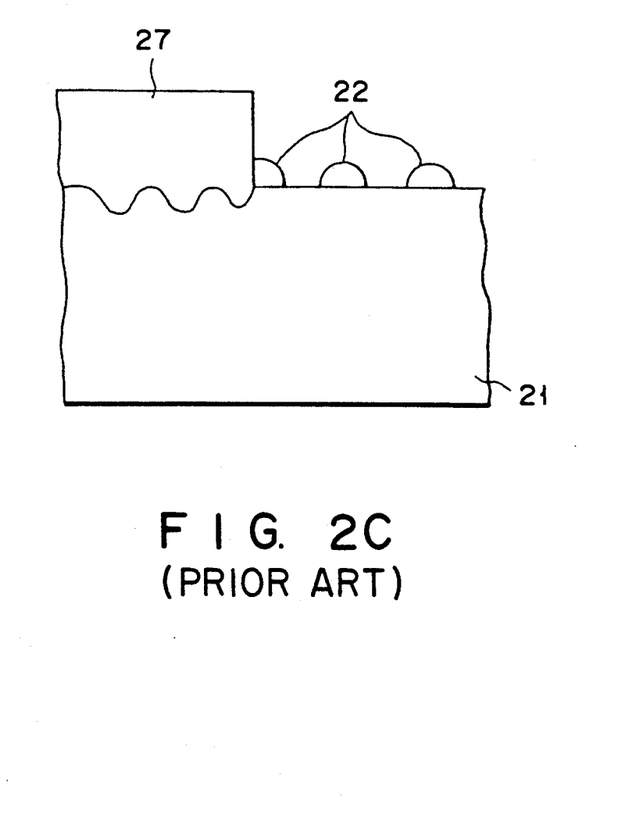
Figure 2D:
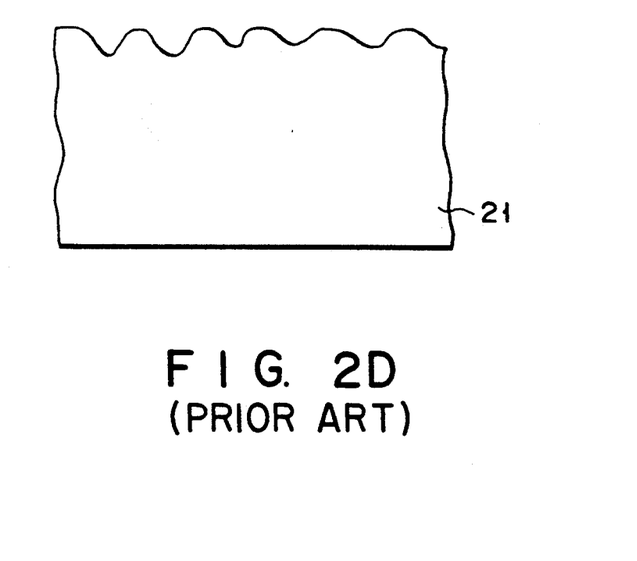

As shown in FIG. 2A, a negative photoresist 22 is formed on an InP substrate 21. An intermediate layer 23 is formed on the negative photoresist 22. A phase shift negative resist film 28 is formed on the intermediate layer 23. Thereafter, the phase shift negative resist film 28 is patterned. A two-beam interference exposing operation is performed using first and second laser beams 26A and 26B. As shown in FIG. 2B, the intermediate layer 23 is removed from a portion which is not covered with the phase shift negative resist film 28. Thereafter, the negative photoresist 22 on this portion is developed. As shown in FIG. 2C, the InP substrate 21 is etched using a hydrogen bromide-based etchant. The negative photoresist 22 is removed from a portion which is not covered with the phase shift negative photoresist 28. In addition, the intermediate layer 23 and the phase shift negative resist film 28 are removed. Thereafter, a positive photoresist (protection film) 27 is formed on only a portion where the InP substrate 21 is etched, and the negative photoresist 22 is developed. As shown in FIG. 2D, the InP substrate 21 is etched using a hydrogen bromide-based etchant, and the negative and positive photoresists 22 and 27 are removed, thereby obtaining a phase-shifted diffraction grating.

In the manufacturing method using the phase shift film, when a photoresist used as the phase shift film is used as a phase shift medium, the photoresist has poor optical accuracy, since the film thickness of the photoresist is decreased during the development. In addition, a photoresist used as the phase shift medium naturally absorbs an ultraviolet beam. For this reason, optimal exposure times are disadvantageously different from each other in the region of the phase shift film and other regions. The method using a glass mask has the following drawbacks. That is, a process of manufacturing the glass mask is complicated, and an undesired multi reflection cannot easily be controlled such that the glass mask is brought into tight contact with an object to be etched during the two-beam interference exposing operation.

In the manufacturing method using positive and negative photoresists or a phase shift film, a phase-shifted diffraction grating is manufactured by two etching processes. In the two etching processes, in order to prevent loss of a diffraction grating after the first etching operation, the diffraction grating is generally protected by coating a photoresist. However, a border between a region protected by the photoresist and a region etched in the second etching process cannot easily be made clear.

As described above, according to the conventional manufacturing method, when a phase-shifted diffraction grating is to be manufactured, the phase-shifted diffraction grating is transferred to a semiconductor substrate by two etching processes. For this reason, this manufacturing method has a unique drawback, and a phase-shifted portion disadvantageously has a step near a border between a region protected by a photoresist and a region etched by the second etching process.

The present invention has been made to solve the above drawbacks, and has as its object to provide a method of manufacturing a diffraction grating in which a uniform diffraction grating having an arbitrary phase shift amount can be formed by one etching process.

DISCLOSURE OF INVENTION

In order to achieve the above object, according to the present invention, a diffraction grating having a discontinuous phase portion can be obtained as follows. A photoresist is coated on a substrate, and a phase shift medium is formed on the photoresist. The phase shift medium is patterned. Thereafter, first and second laser beams having asymmetric incidence angles with respect to the substrate are radiated on the photoresist to perform an interference exposure operation. Thereafter, the photoresist is developed and post-baked, and the substrate is etched using the photoresist as a mask, thereby obtaining a diffraction grating having a discontinuous phase portion.

BEST MODE FOR CARRYING OUT THE INVENTION

An embodiment of the present invention will be described below with reference to the accompanying drawings.

FIGS. 3A to 3F show a method of manufacturing a phase-shifted diffraction grating according to the first embodiment of the present invention.

Figure 3A:
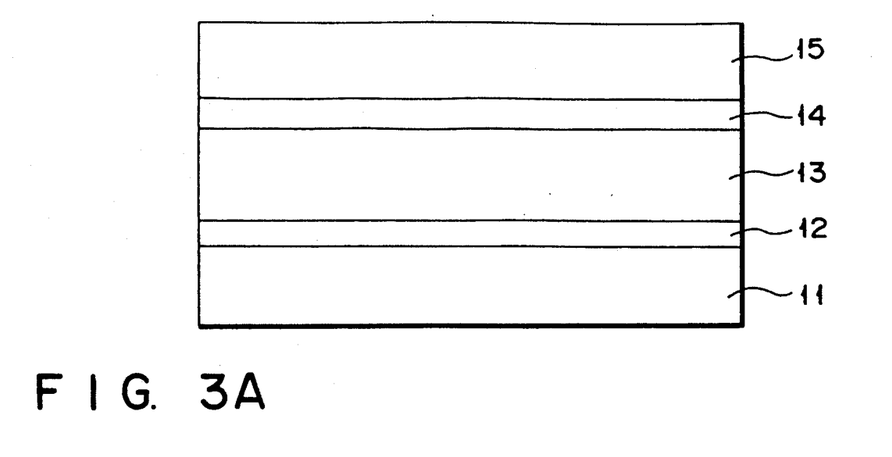
FIGS. 3A to 3F are sectional views showing a method of manufacturing a phase-shifted diffraction grating according to the first embodiment of the present invention.
Figure 3B:
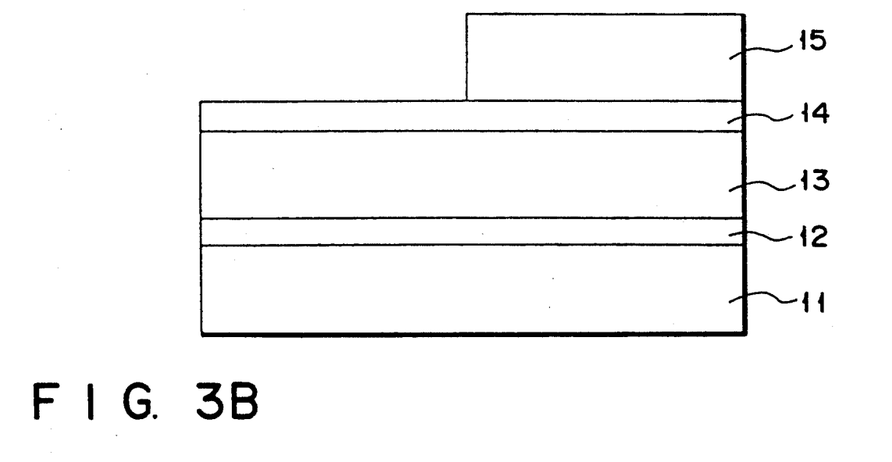
Figure 3C:
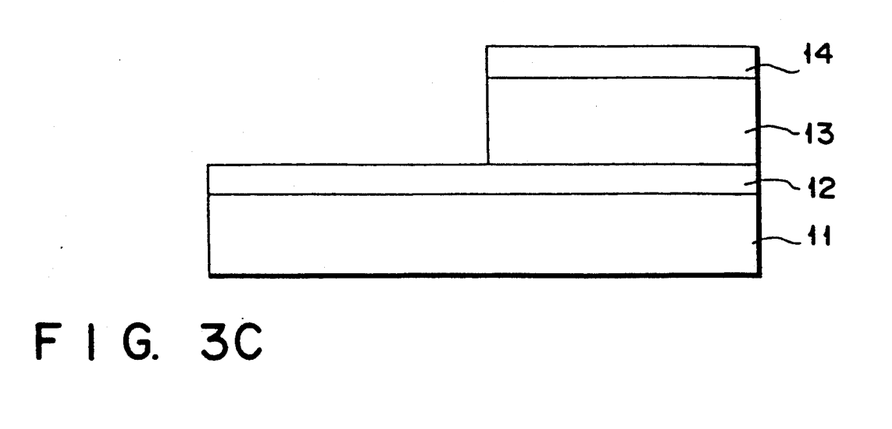
Figure 3D:
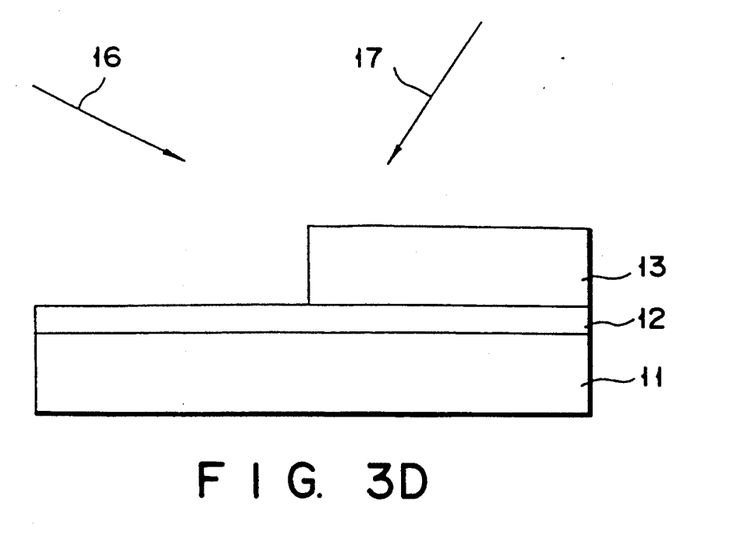
Figure 3E:
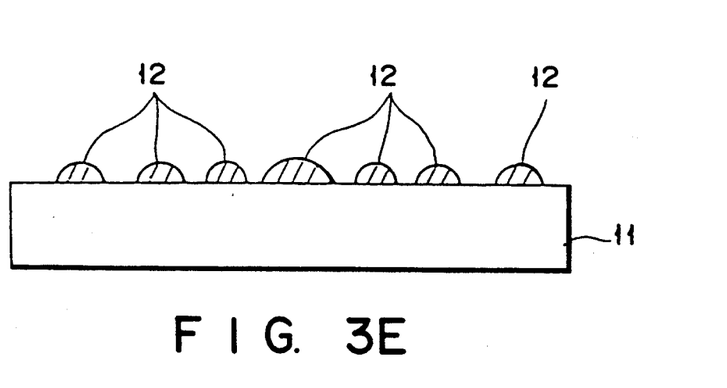
Figure 3F:
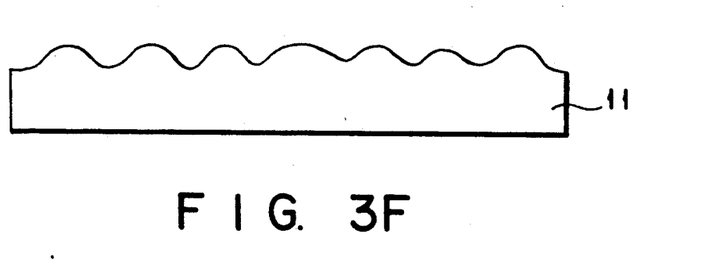

As shown in FIG. 3A, a first photoresist 12 is coated on an InP substrate 11. A dielectric film 13 such as a coating oxide film or an $SiO_2$ film is formed on the first photoresist 12 as a phase shift medium. A Cr film 14 is deposited on the dielectric film 13. A second photoresist 15 is coated on the Cr film 14. The Cr film 14 prevents radiation of an ultraviolet beam on the first photoresist 12 during exposure of the second photoresist 15. Therefore, other metal films each having an effect for cutting off an ultraviolet beam may be used in place of the Cr film 14. As shown in FIG. 3B, the second photoresist 15 is patterned. Note that end portions of the photoresist 15 serve as phase-shifted portions. As shown in FIG. 3C, the Cr film 14 is patterned using the second photoresist 15 as a mask. After the second photoresist 15 is removed, the dielectric film 13 serving as a phase shift medium is patterned using the Cr film 14 as a mask by, e.g., a hydrogen fluoride-based solution. As shown in FIG. 3D, after the Cr film 14 is removed, first and second laser beams 16 and 17 having asymmetric incidence angles with respect to the InP substrate 11 are radiated on the first photoresist 12 to perform a two-beam interference exposing operation. As shown in FIG. 3E, after the dielectric film 13 is removed, the first photoresist 12 is developed and post-baked. As shown in FIG. 3F, the InP substrate 11 is etched using the first photoresist 12 as a mask by a hydrogen bromide etchant. Thereafter, the first photoresist 12 is removed, thereby obtaining a phase-shifted diffraction grating.

FIGS. 4A to 4F show a method of manufacturing a phase-shifted diffraction grating according to the second embodiment of the present invention.

Figure 4A:
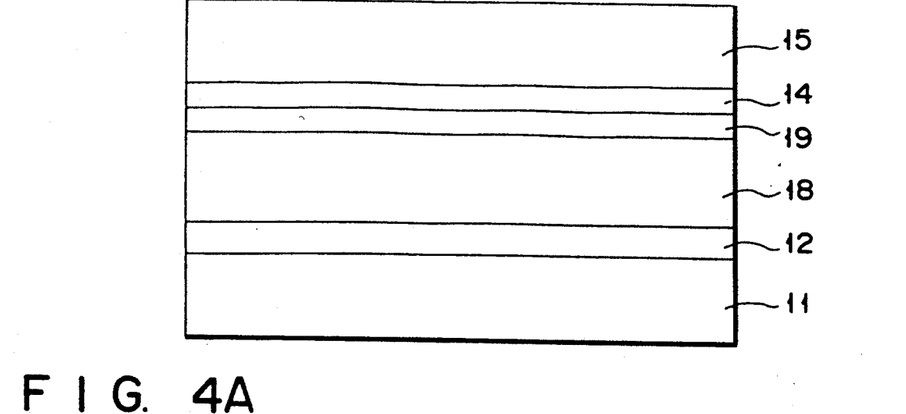
FIGS. 4A to 4F are sectional views showing a method of manufacturing a phase-shifted diffraction grating according to the second embodiment of the present invention.
Figure 4B:
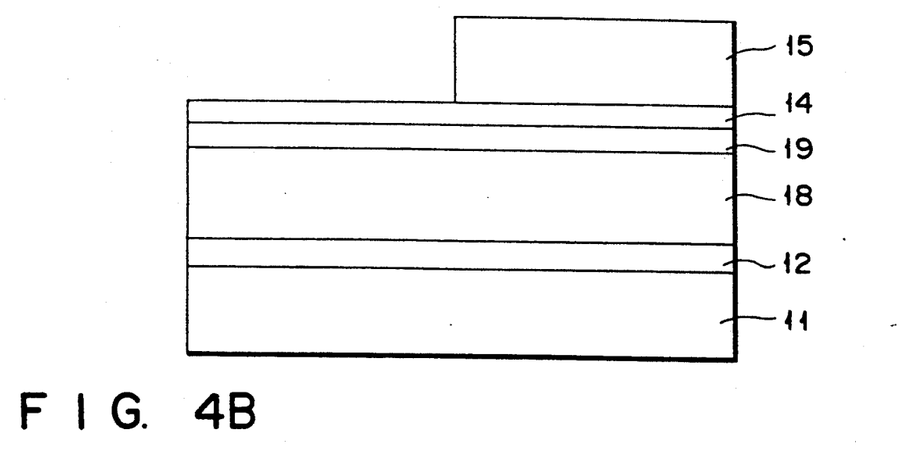
Figure 4C:
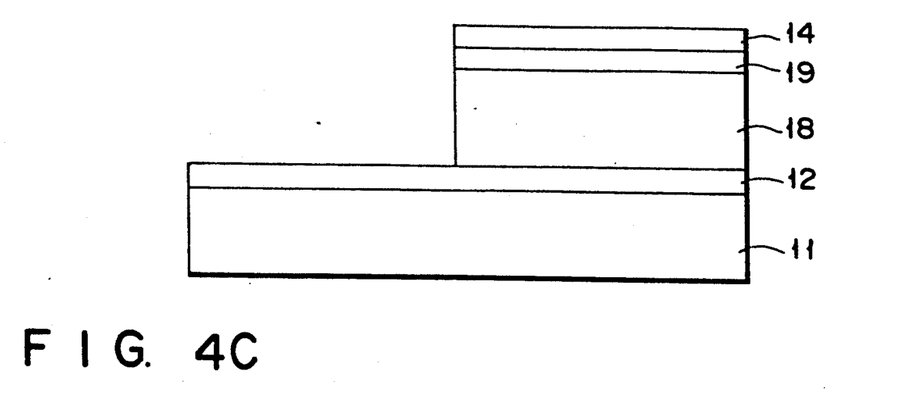
Figure 4D:
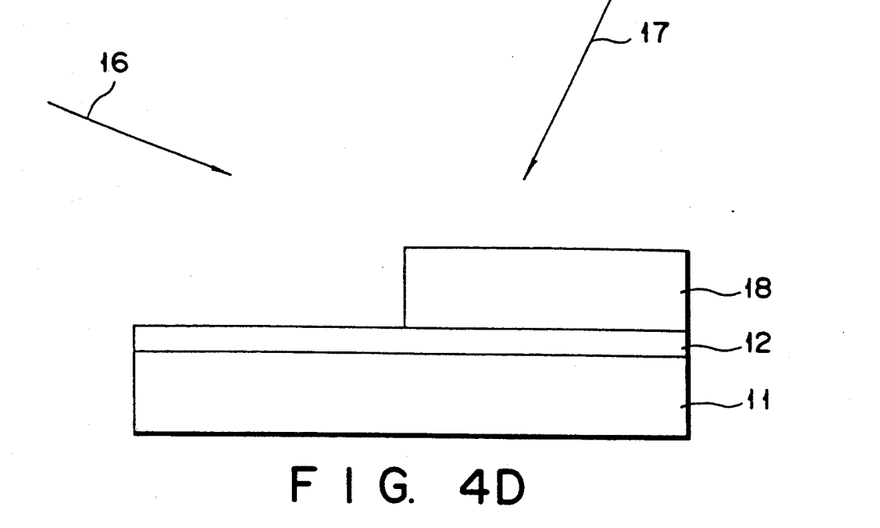
Figure 4E:
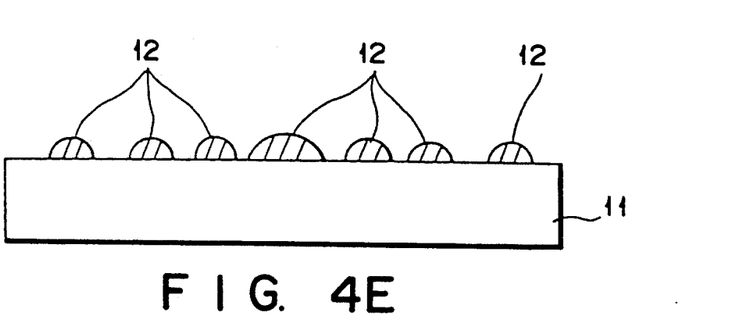
Figure 4F:
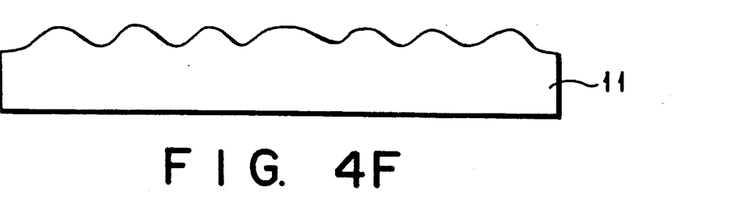

As shown in FIG. 4A, a first photoresist 12 is coated on an InP substrate 11. A rubber-based resin film 18 is coated on the first photoresist 12 as a phase shift medium. A coating oxide film 19 is coated on the rubber-based resin film 18. A Cr film 14 and a second photoresist 15 are sequentially formed on the coating oxide film 19. As in the first embodiment, the Cr film 14 prevent radiation of an ultraviolet beam on the first photoresist 12 during exposure of the second photoresist 15. Therefore, other metal films each having an effect for cutting off an ultraviolet beam may be used in place of the Cr film 14. As shown in FIG. 4B, the second photoresist 15 is patterned. End portions of the photoresist 15 serve as phase-shifted portions. As shown in FIG. 4C, the Cr film 14 is patterned using the second photoresist 15 as a mask, and the second photoresist 15 is removed. Thereafter, the coating oxide film 19 is patterned using the Cr film 14 as a mask by a hydrogen bromide-based solution. The rubber-based resin film 18 is patterned using the Cr film 14 as a mask by a butyl acetate solution. As shown in FIG. 4D, after the Cr film 14 and the coating oxide film 19 are removed, a two-beam interference exposing operation is performed by first and second laser beams 16 and 17 having asymmetric incidence angles with respect to the InP substrate 11. As shown in FIG. 4E, after the rubber-based resin film 18 is removed, the first photoresist 12 is developed and post-baked. As shown in FIG. 4F, the InP substrate 11 is etched using a hydrogen bromide-based etchant. Thereafter, the first photoresist 12 is removed, thereby obtaining a phase-shifted diffraction grating.

According to the first and second embodiments, a phase-shifted diffraction grating is transferred by one etching process. For this reason, when an InP substrate is used as a semiconductor substrate, a diffraction grating which has a stable shape, a period of 1,900 to 2,600 [Å], without any step at a phase-shifted portion can be obtained at a high yield. According to the first and second embodiments, when a thickness of a dielectric film or a rubber-based resin film is changed, the phase of the diffraction grating can be shifted by an arbitrary amount from 0 to $\pi$.

Figure 5:
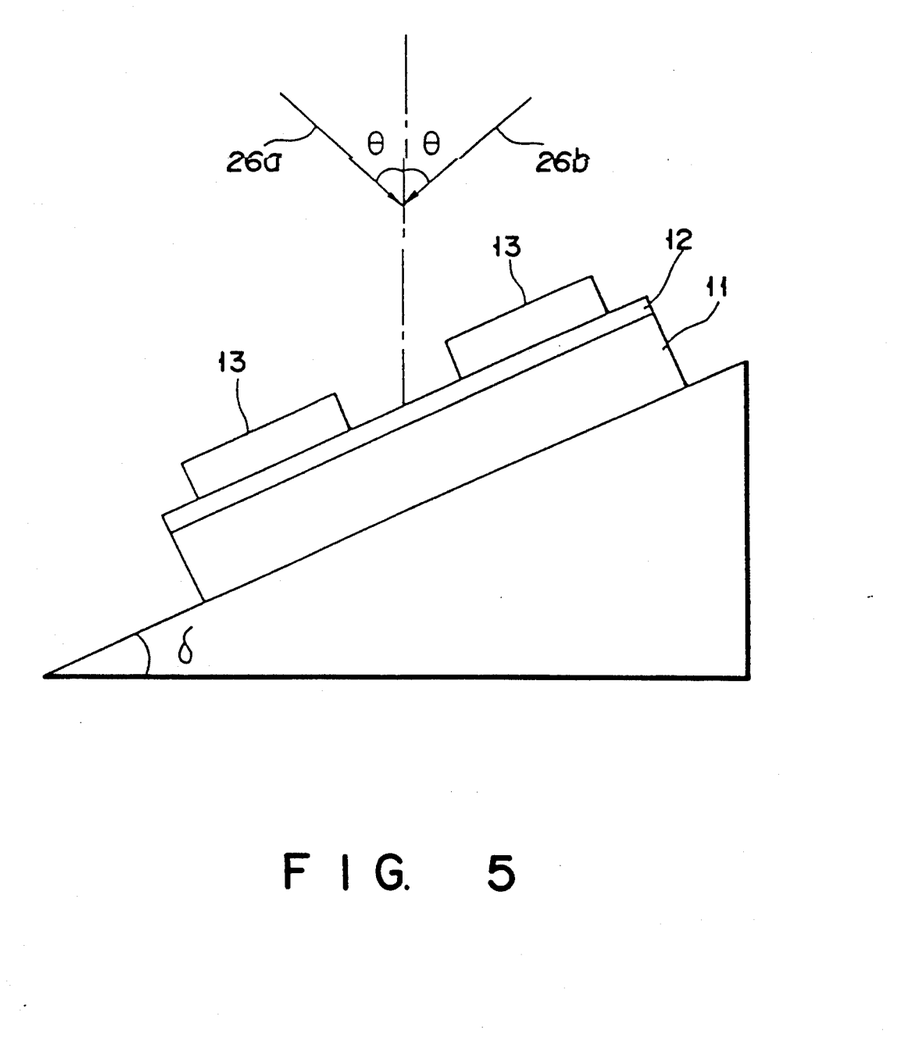
FIG. 5 is a view for explaining a principle of a two-beam interference exposing method.

In this case, in the first and second embodiments, when the rotational angle $\delta$ of the InP substrate 11 is set to be 15× and the period of the diffraction grating is set to be 2,400 [Å], each of the thicknesses of the dielectric film and the rubber-based resin film required for shifting the phase of the diffraction grating by $\pi$ is about 1 $\mu$m (see FIG. 5).

Upon two-beam interference exposure, when incidence angles $\theta$ of the two beams are fixed, the period and phase shift amount of the diffraction grating are defined by the rotational angle $\theta$ of the InP substrate 11 and the thickness of a phase shift medium (the dielectric film 13 or the rubber-based resin film 18). For example, the rotational angle k of the InP substrate 11 is fixed, the period of the diffraction grating is constant. In this case, an arbitrary phase shift amount can be obtained by changing the thickness of the phase shift medium. In addition, when the phase shift medium is removed before the first photoresist 12 is developed, a phase-shifted diffraction grating can be transferred to the InP substrate by one etching process.

I claim:

1. A method of manufacturing a phase-shifted diffraction grating characterized by comprising the steps of:
    coating a photoresist on a substrate;
    forming a phase shift medium on said photoresist;
    patterning said phase shift medium;
    radiating first and second laser beams having asymmetric incidence angles with respect to said substrate on said photoresist to perform an interference exposing operation;
    removing said phase shift medium;
    developing and post-baking said photoresist; and
    etching said substrate using said photoresist as a mask to form a diffraction grating having a discontinuous phase portion.

2. A method of manufacturing a phase-shifted diffraction grating according to claim 1, characterized in that said phase shift medium is an $SiO_2$ film.

3. A method of manufacturing a phase-shifted diffraction grating according to claim 1, characterized in that said phase shift medium is patterned such that an end portion of said phase shift medium is located at a phase-shifted portion.

4. A method of manufacturing a phase-shifted diffraction grating according to claim 1, characterized in that said substrate is etched by an etchant containing hydrogen bromide.

* * * * *